(12) United States Patent
Huang et al.

(10) Patent No.: US 11,572,778 B2
(45) Date of Patent: *Feb. 7, 2023

(54) METHOD AND APPARATUS FOR OPTIMIZED UNDERBALANCED DRILLING

(71) Applicant: Landmark Graphics Corporation, Houston, TX (US)

(72) Inventors: Xiaoqian Huang, Katy, TX (US); Robello Samuel, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/868,071

(22) Filed: Jul. 19, 2022

(65) Prior Publication Data

US 2022/0356786 A1 Nov. 10, 2022

Related U.S. Application Data

(63) Continuation of application No. 15/035,479, filed as application No. PCT/US2013/072322 on Nov. 27, 2013, now Pat. No. 11,428,076.

(51) Int. Cl.
*G06F 30/20* (2020.01)
*E21B 44/00* (2006.01)
(Continued)

(52) U.S. Cl.
CPC .............. *E21B 44/00* (2013.01); *E21B 21/08* (2013.01); *E21B 21/085* (2020.05); *E21B 41/00* (2013.01); *G06F 30/20* (2020.01)

(58) Field of Classification Search
CPC .... E21B 21/08; E21B 41/0092; E21B 21/085; F21B 41/00; G06F 17/5009; G06F 30/13; G06F 30/20
(Continued)

(56) References Cited

U.S. PATENT DOCUMENTS 4,442,710 A * 4/1984 Meng .................... E21B 49/087
702/12
5,561,245 A * 10/1996 Georgi .................... E21B 47/10
73/861.04
(Continued)

OTHER PUBLICATIONS

"CA Application No. 2925472, Examiner Letter dated Nov. 30, 2016".
(Continued)

*Primary Examiner* — Andre Pierre Louis
(74) *Attorney, Agent, or Firm* — Kilpatrick Townsend & Stockton LLP

(57) ABSTRACT

The invention concerns a computer implemented method for underbalanced drilling. In one embodiment, the method includes determining a plurality of gas injection rate versus bottom hole pressure curves for a plurality of liquid injection rates for a specified minimum and maximum gas injection rate and a minimum and maximum liquid injection rate. Next, the method determines a set of four interception curves including a minimum motor equivalent liquid rate interception curve, a minimum vertical liquid velocity intercept curve, a minimum horizontal liquid velocity intercept curve, and a maximum motor equivalent liquid rate intercept curve for a specified minimum and maximum mud motor rate range and a minimum horizontal and vertical annulus velocity.

17 Claims, 6 Drawing Sheets

(51) Int. Cl.
*E21B 21/08* (2006.01)
*E21B 41/00* (2006.01)

(58) Field of Classification Search
USPC .................................................. 703/7, 9, 10
See application file for complete search history.

(56) References Cited

U.S. PATENT DOCUMENTS

| | | |
|---|---|---|
| 2002/0112892 A1* | 8/2002 | Taylor ..................... E21B 7/062 |
| | | 175/76 |
| 2003/0139916 A1 | 7/2003 | Choe et al. |
| 2004/0060737 A1 | 4/2004 | Deboer |
| 2005/0092522 A1 | 5/2005 | Humphreys |
| 2005/0096847 A1 | 5/2005 | Huang |
| 2005/0192855 A1 | 9/2005 | Chitty et al. |
| 2009/0165548 A1* | 7/2009 | Pop ....................... E21B 49/008 |
| | | 73/152.51 |
| 2010/0096128 A1 | 4/2010 | Hinkel et al. |
| 2012/0175113 A1 | 7/2012 | Bullock et al. |
| 2016/0090832 A1 | 3/2016 | Mock |

OTHER PUBLICATIONS

"PCT Application No. PCT/US2013/072322, International Preliminary Report of Patentability, dated May 31, 2016", 6 pages.
"PCT Application No. PCT/US2013/072322, International Search Report and Written Opinion, dated Apr. 15, 2014", 8 pages.
U.S. Appl. No. 15/035,479, "Notice of Allowance", dated Apr. 14, 2022, 7 pages.

* cited by examiner

US 11,572,778 B2

METHOD AND APPARATUS FOR OPTIMIZED UNDERBALANCED DRILLING

This application is a continuation of U.S. application Ser. No. 15/035,479, filed on May 9, 2016, and entitled, "METHOD AND APPARATUS FOR OPTIMIZED UNDERBALANCED DRILLING," which is a National Stage Entry of PCT Application No. PCT/US2013/072322, filed on Nov. 27, 2013, entitled, "METHOD AND APPARATUS FOR OPTIMIZED UNDERBALANCED DRILLING," the entirety of both are incorporated by reference herein for all purposes.

FIELD OF INVENTION

The embodiments disclosed herein relate generally to methods and systems for optimizing Underbalanced Drilling ("UBD").

BACKGROUND OF INVENTION

Underbalanced drilling is a technique used to drill oil and gas wells. Unlike traditional overbalanced drilling, the wellbore pressure is kept lower than the formation pressure. Underbalanced drilling provides several advantages over overbalanced drilling. It reduces drilling fluid invasion of the wellbore, which decreases wellbore damage and can reduce clean up time and improve recovery. It also allows the well to produce during drilling, which can increase the knowledge about the well itself. However, there is a need in the art for more reliable and accurate 2D underbalanced operation parameters to be calculated and communicated to drilling engineers. In particular, there is a need to quickly allow a drilling engineer with the ability to determine the hydrostatic, friction, and transition areas associated with the UBD drilling envelope. There is also a need to provide UBD drilling engineers with a way to dynamically visualize the 2D UBD operation envelope based on mud motor properties and the minimum horizontal and vertical hole cleaning requirements.

DETAILED DESCRIPTION OF DISCLOSED EMBODIMENTS

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Embodiments of the invention provide improved computer implemented methods to determine and provide an optimized visual two-dimensional operation envelope to underbalanced drilling ("USD") drilling engineers during UBD operations. This allows UBD engineers to dynamically visualize the UBD envelope determined by established mud motor parameters and minimum horizontal and vertical hole cleaning parameters. In embodiments, this information may be provided against a background of the overview graph of borehole pressure changes versus the gas injection rate, as constrained by a target pressure line. In embodiments, the UBD drilling engineer will be able to quickly determine the three main hydraulic zones, namely, the hydrostatic dominated zone, the friction dominated zone, and the transition zone. These embodiments will provide UBD engineers an accurate and reliable reference to select mud motors and define practical UBD parameters within the UBD interest area.

Figure 2:
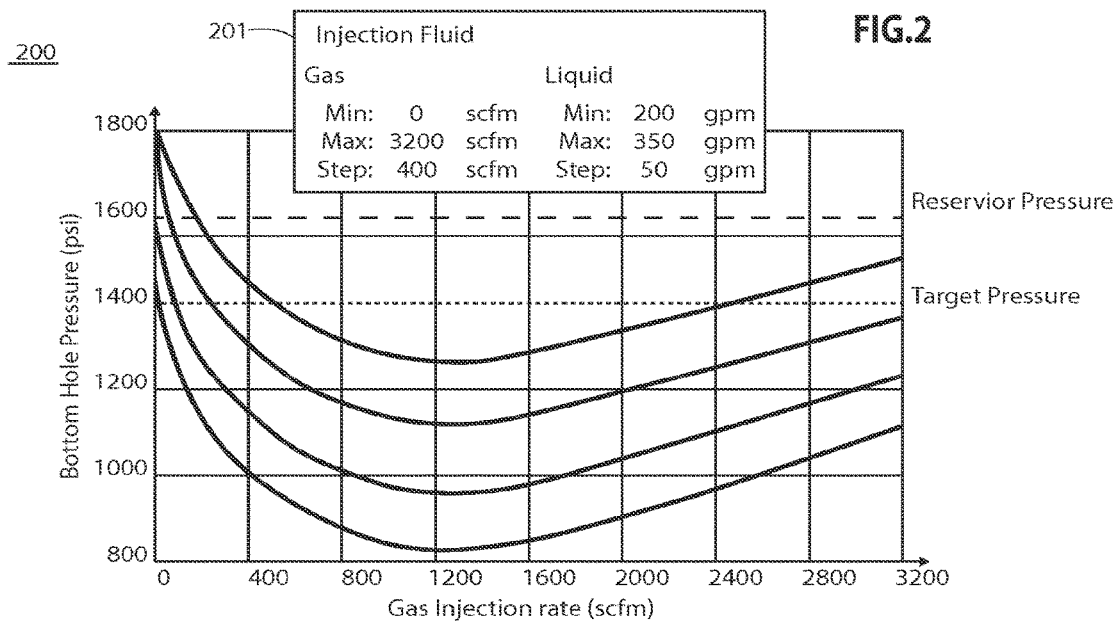
FIG. 2 is a graph illustrating an example of a two-dimensional ("2D") operating envelope according to an embodiment of the invention.

In this embodiment, the method begins at block 101 by calculating and plotting a series of gas injection rate versus bottom hole pressure curves (GIR vs. BHP) for different liquid injection rates based on a specified minimum and maximum gas injection rate range and a minimum and maximum liquid injection rate. FIG. 2 illustrates a graph of gas injection rate versus bottom hole pressure curves, according to an embodiment. The bottom hole pressure, in PSI, is plotted along the Y axis of the graph 200. The gas injection rate, in standard cubic feet per minute, is plotted along the X axis of the graph 200. The liquid injection rate curves, plotted on the graph, are varied from 200 gallons per minute to 350 gallons per minute. According to an embodiment, a pop-open dialogue box 201 is also provided that allows a UBD engineer to enter a range of injection rates for gas and liquid. The gas used in UBD operations is advantageously a non-flammable, inert gas, such as nitrogen. When the injected gas combines with the injected liquid, two phase flow conditions are created in the well bore. This reduces the equivalent density of the drilling mud along with its hydrostatic pressure.

Figure 3:
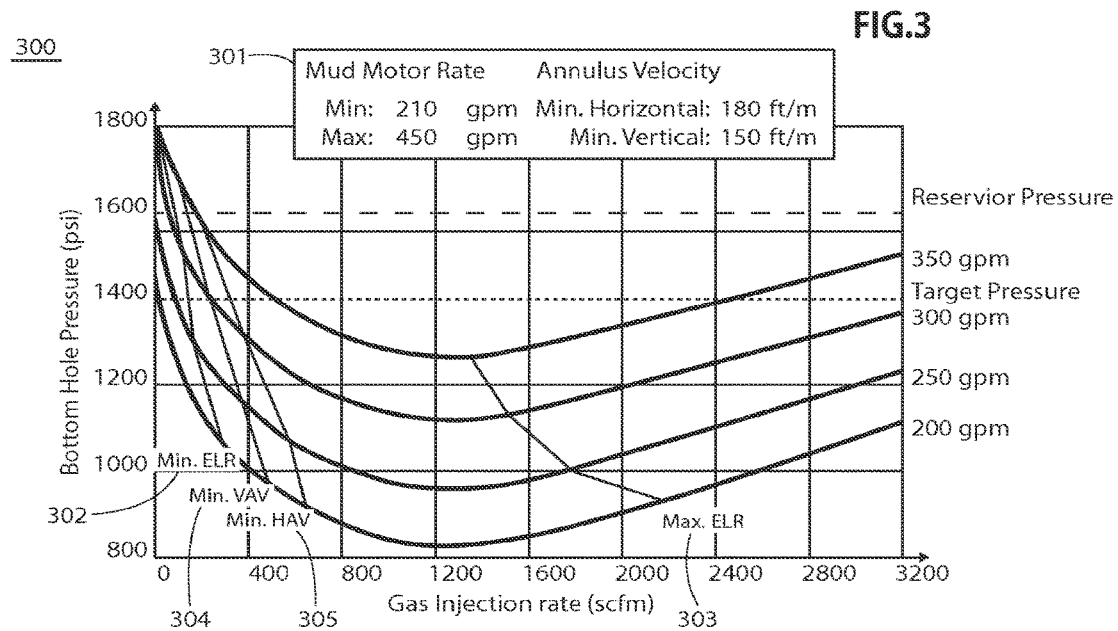
FIG. 3 is a graph illustrating an example of a 2D operating envelope according to an embodiment of the invention.

Next, the method according to an embodiment proceeds to block 102 where it calculates and plots a set of four interception curves based on a specified minimum and maximum mud motor rate range, and minimum horizontal and vertical annulus velocity parameters. Advantageously, these curves include curves for the minimum motor equivalent liquid rate ("ELR"), minimum vertical liquid velocity (or minimum vertical hole cleaning velocity), minimum horizontal liquid velocity (or minimum horizontal hole cleaning velocity), and maximum motor ELR. FIG. 3 depicts a graph showing the bottom hole pressure versus the gas injection rate following this step of the method. In one embodiment, dialogue box 301 is provided to allow the UBD engineer to enter the parameters for the mud motor rate in annulus velocity permitted by the physical design of the system. In the particular embodiment illustrated, the mud motor rate range is specified at a minimum of 210 gallons per minute and a maximum of 450 gallons per minute. The annulus velocity permitted in the well bore is specified to be a minimum horizontal velocity of 180 feet per minute and a minimum vertical velocity of 150 feet per minute. Based upon this information, a suitable UBD calculation engine, for example, Decision Space Well Engineering, available from Landmark Graphics, Corp., calculates the minimum and maximum equivalent liquid rates and the minimum vertical and horizontal annulus velocity rates under the well bore conditions. In this case, these calculations would be performed for liquid injection rates from 200 gallons per minute to 350 gallons per minute. The method then plots interception curves 302 and 303, representing the minimum and maximum equivalent liquid rates, respectively, and interception curves 304 and 305, representing the minimum vertical annular velocity and minimum horizontal annular velocity.

Figure 4:
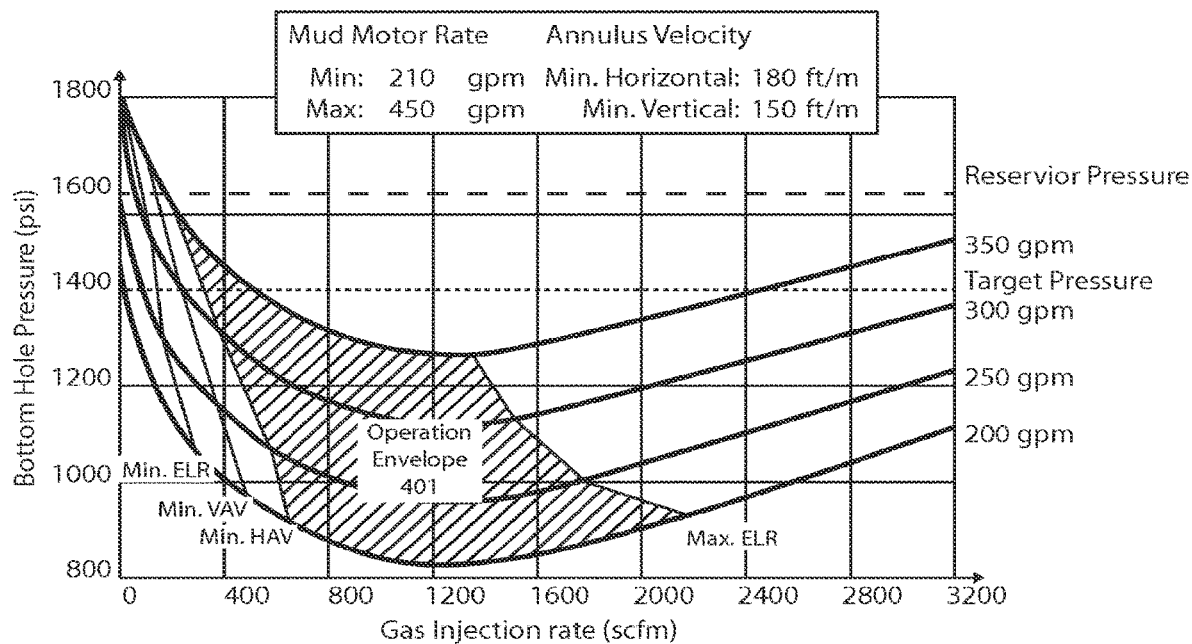
FIG. 4 is a graph illustrating a 2D operating envelope, according to an embodiment of the invention.
Figure 5:
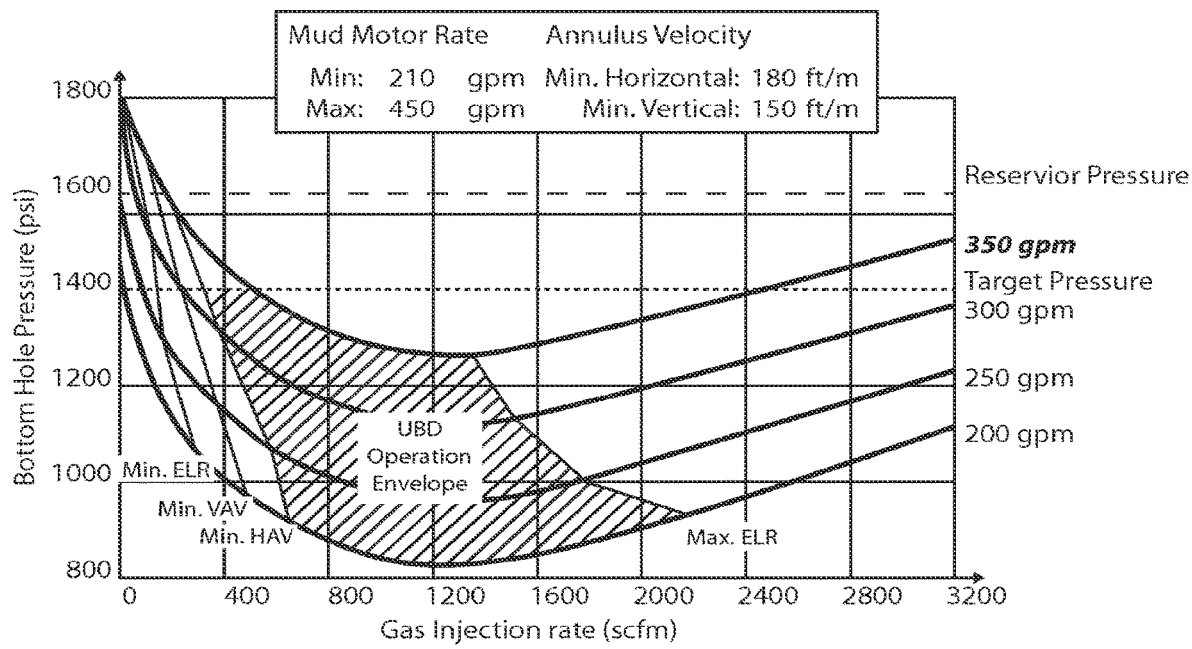
FIG. 5 is a graph illustrating an example of a 2D operating envelope according to an embodiment of the invention.

The method then proceeds to blocks 103 and 104 where it identifies the operation envelope. FIG. 4 is a graph depicting the bottom hole pressure versus the gas injection rate chart, such as shown in FIG. 3, with the operation envelope 401 identified in the shaded region. The operation envelope is determined by identifying the points between the region bounded by the uppermost intercept line along the gas injection rate axis, in this case the maximum equivalent liquid rate, and the next-closest intercept line, in this case the minimum horizontal annulus velocity. UBD operations outside of the operation envelope 401 would possibly be in violation of the specifications allowed in the UBD drilling environment. In an embodiment, a visual display is created on a suitable computer monitor that identifies and highlights the operation envelope zone. The operation envelope zone on the display is surrounded by curves of minimum horizontal liquid velocity, maximum motor ELR, minimum liquid injection curve and maximum liquid injection curve to allow the UBD engineer to quickly and accurately make decisions necessary to operate the well in a satisfactory UBD condition. The intersection points between operation envelope zone and target pressure curve are then calculated. The under balance drilling operation zone may then identified and color-marked on the display. FIG. 5 shows a bottom hole pressure versus gas injection rate chart with the UBD operation envelope identified according to an embodiment of the invention.

Figure 1:
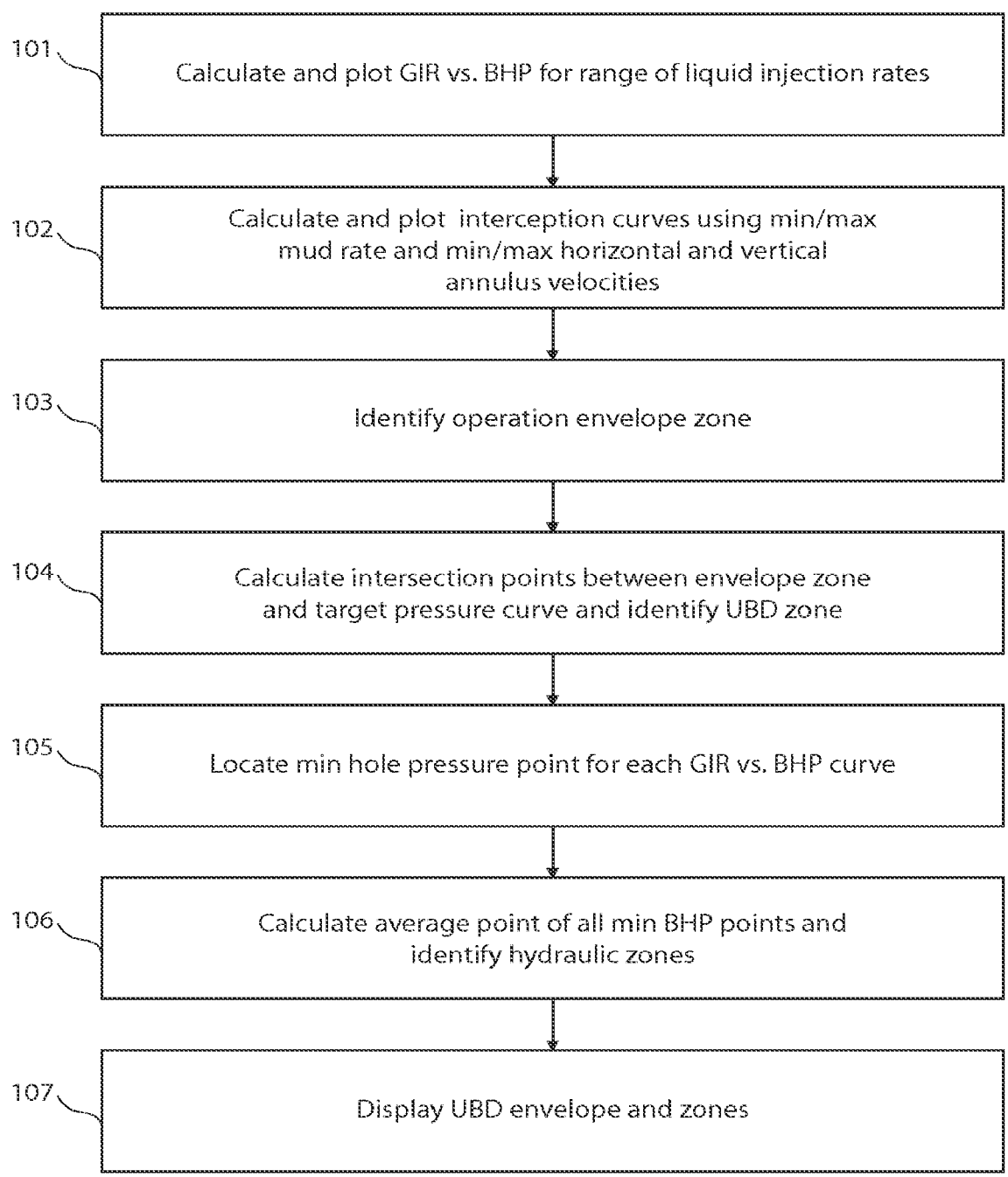
FIG. 1 is a flow chart for a computer-implemented method for optimizing UBD according to an embodiment of the invention.
Figure 6:
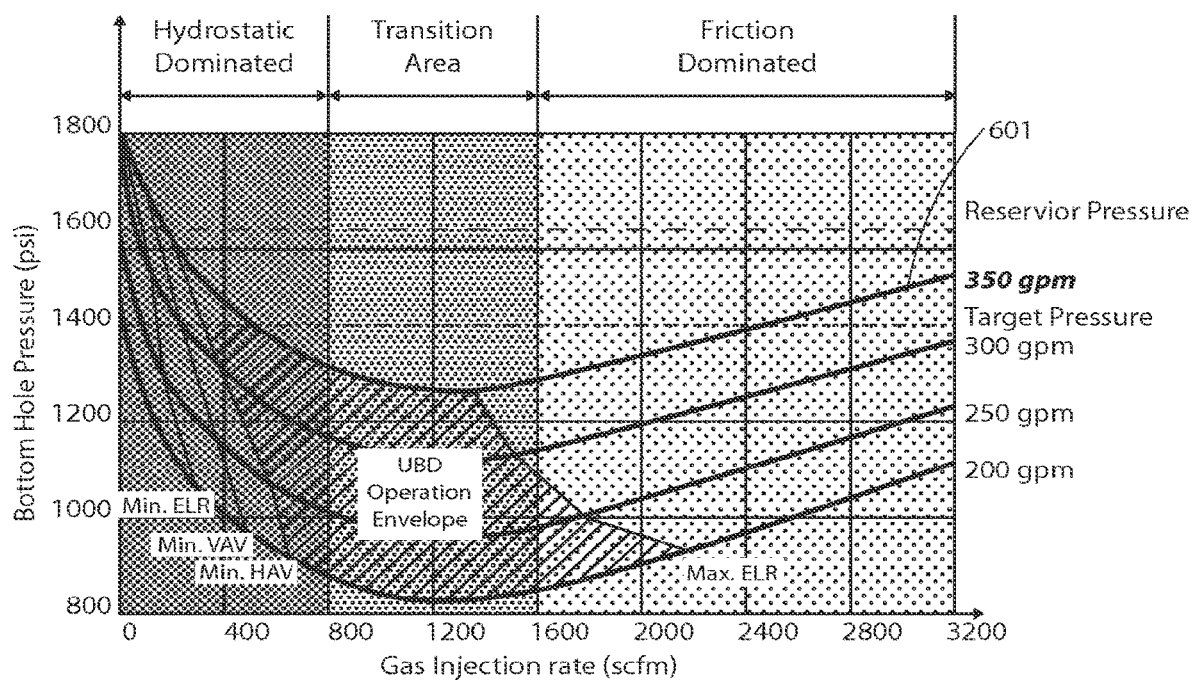
FIG. 6 is a chart illustrating an example of a 2D operating envelope according to an embodiment of the invention.

Referring again to FIG. 1, the method according to an embodiment then proceeds to block 105 where it identifies the minimum hole pressure point for each GIR versus BHP curve. Once the minimum bottom hole pressure points are determined, the method proceeds to block 106 where it calculates the average point of all the minimum BHP points. Based on the average BHP point, The method then the hydrostatic dominated zone is the hydraulic zone in which the bottom hole pressure is determined primarily by the density of the liquid in the well bore. In this region, increasing the gas injection rate will decrease the effective density of the well bore fluid and lower the bottom hole pressure. This effect is seen in the declining region on the left-hand side of the charts in FIGS. 1-4 as the bottom hole pressure decreases with an increasing gas injection rate. The friction-dominated zone is the hydraulic zone in which the friction from the amount of gas returning through the well bore begins to increase the bottom hole pressure. In this region, increasing the gas injection rate will increase, rather than decrease, the bottom hole pressure. This region is seen on the right-hand side of charts 1-4 with the increasing bottom hole pressures as the gas injection rate increases. The transition zone is the hydraulic zone in which there is a transition between the hydrostatic-dominated and the friction-dominated zones. This region is seen in the portions of the pressure curves where the rate of change is more or less flat as the gas injection rate changes. FIG. 6 is a chart showing the optimized UBD operation envelope where the different hydrostatic zones, as calculated in block 106, are identified in the bottom hole pressure versus gas injection rate graph. The target pressure line is also indicated on the graph, and, as can be seen in the example, truncates a portion of the hydrostatic-dominated hydraulic zone in the upper left-hand region of the UBD operation envelope. This information is also displayed to the UBD engineer, providing the engineer with an accurate and detailed understanding of the UBD operation envelope. This allows the UBD engineer to quickly understand and control the operating conditions in the well bore. In block 107, all the information determined in blocks 101-106 is then displayed on a suitable computer monitor to the UBD engineer. The information may also be provided in other forms, such as a chart or spread sheet, and, maybe printed out or otherwise manipulated as a matter of design choice, divides the GIR versus BHP plane into three hydraulic zones: hydrostatic dominated zone, friction dominated zone and transition zone.

Versions of the invention may also be embodied in as computer implemented method for underbalanced drilling. In one embodiment, the method includes determining a plurality of gas injection rate versus bottom hole pressure curves for a plurality of liquid injection rates for a specified minimum and maximum gas injection rate and a minimum and maximum liquid injection rate.

Calculating the curves may be performed according to formulas known to those of skill in the art taking into account the specifications of the UBD hydraulics and mud motor details according to the system. The calculations may be done interactively to bracket the envelope and the areas are highlighted to show the envelope by identifying the crossover points.

Next, the method includes determining a set of four interception curves including a minimum motor equivalent liquid rate interception curve, a minimum vertical liquid velocity intercept curve, a minimum horizontal liquid velocity intercept curve, and a maximum motor equivalent liquid rate intercept curve for a specified minimum and maximum mud motor rate range and a minimum horizontal and vertical annulus velocity.

The range of flowrates and the limit lines such as mud motor ELR rates are used to bracket the envelope.

After the interception curves are created, then method then identifies an operation envelope based on the interception curves. The operation envelope is the area under the curves in an advantageous version of the invention.

In further embodiments, additional restrictions could be applied to modify the operation envelope, such as providing additional limits such as rig capacity of pumping to that an exterior and interior envelope could be created.

Next, the method may then determine the intersection points between the operation envelope and a target pressure curve to define a UBD operation zone. The method then may determine the minimum bottom hole pressure point for each gas injection rate versus bottom hole pressure curve and the determine the average point of all minimum bottom hole pressure points. So, in this particular embodiment it is seen that there are 4 minimum BHP points at around 1200 scfm, one for each of the four curves.

Once the average points of the bottom hold pressures are calculated, the method may then determine a plurality of hydraulic zones based on the average of all minimum bottom hole pressure points, such as the hydrostatic dominated zone, the friction dominated zone, and the transition zone. Of course, it will be understood that the boundaries are not always clearly defined depending on conditions and in other embodiments are extrapolated to bracket the boundaries.

Afterward, the method may then display an optimized UBD operation envelope simultaneously depicting and identifying the UBD operation zone and the plurality of hydraulic zones. The display may be implemented on a computer monitor with the optimized UBD operation zone indicated in a manner that provides a UBD engineer with a quick and accurate determination of its location. For example, it may be highlighted in a color that provides a high-contrast with the graph background. The display also may include the interception line cross points, and the boundaries for the minimum and maximum horizontal liquid velocity, liquid injection curve and motor equivalent liquid rate. The display may also clearly identify the different hydraulic zones, for example, by color and/or suitable textual labeling. The display may also combine the optimized UBD operation envelope zone plot with the plot for the gas injection rate (GIR) versus bottom hole pressure (BHP) curves for the liquid at different flow rates. Also, the display may be provided on a print out or other tangible medium.

Figure 7:
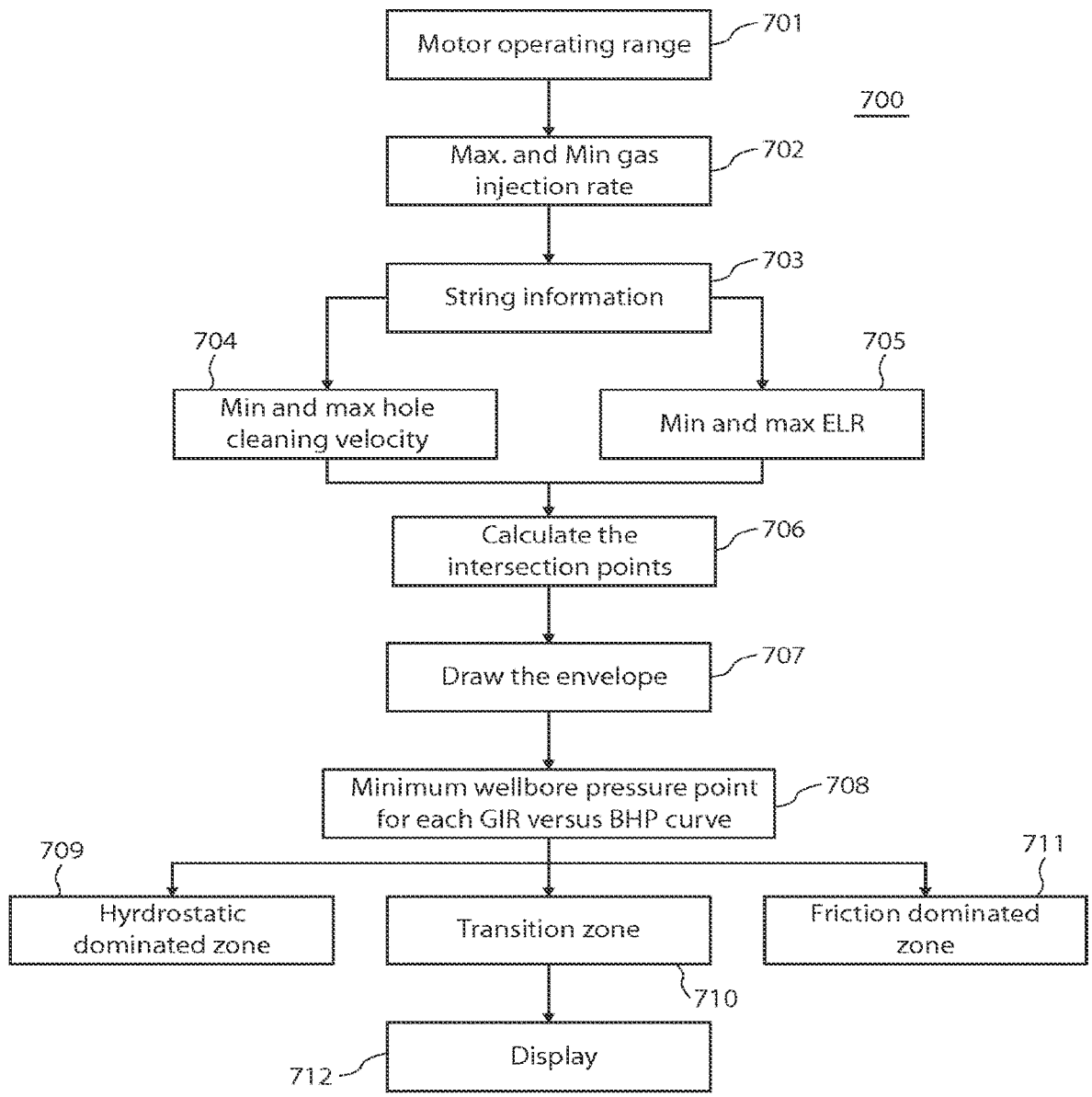
FIG. 7 is a work flow diagram according to an embodiment of the invention.

FIG. 7 is a workflow diagram 700 according to one embodiment of the invention. This diagram indicates the work flow that a UBD engineer would follow in determining an optimized 2D operation envelope for underbalanced drilling in accordance with the invention. In block 701 the motor operating range is determined. One piece of equipment generally used in connection with underbalanced drilling is a positive displacement motor, or "mud motor." As will be understood by those of skill in the art, a mud motor is used to rotate the drill bit without rotating the drill string. Mud motors typically use a stator and a shaft enclosed in a housing. The shaft typically has a series of lobes and fits into the stator which has a different number of lobes than on the shaft. Drilling fluid, also called mud, is pumped through the motor which causes an eccentric motion of the shaft. An example of a conventional mud motor useful in an embodiment of the invention would be the All mud motors are designed to operate within certain specified fluid flow rates for the drilling fluid, normally specified in gallons-per-minute (GPM).

If the flow rate through the motor is too low then the motor may not have sufficient energy to rotate the shaft of the motor. If the flow rate is too high, then the rotational torque will be too high and the speed will be too low.

It is useful in underbalanced drilling circulation systems to use drilling fluids having more than one phase in order to maintain a desired bottom hole pressure. Therefore, in an underbalanced drilling arrangement, a gas, such as nitrogen, or a lighter weight fluid, may be added to the drilling fluid for pressure control.

In block 702, the maximum and minimum gas injection rate is determined based on the hole cleaning parameters, combustion level, hole erosion specifications, and other parameters which will be known to those of skill in the art for their particular drilling conditions.

In block 703, the string information is gathered. The drill string information includes information concerning the size and type of the drill pipe used in the string. The information also includes specifications for other components which may be included in a drill string, such as the bottom hole assembly.

In block 704, the minimum and maximum hole cleaning velocity are determined. These parameters are determined based on the slip velocity of the cuttings, size, shape and weight of the cuttings, and the fluid properties.

In block 705, the maximum and minimum Equivalent Liquid Rate is determined as discussed above. These parameters are determined based on the configuration of the mud motor and its capacity so that desired speed and torque are obtained.

After the calculations in blocks 704 and 705, the work flow proceeds to blocks 706, 707, and 708 where the computer-implemented method calculates the intersection points between the intercept lines and the liquid injection rate, draws the UBD operation envelope and identifies the minimum well bore pressure point for each GIR vs. BHP. Based on the average value of these pressure points, the work flow then proceeds to blocks 709, 710, and 711 where it identified the hydrostatic, transition, and friction dominated zones of the 2D UBD operation envelope. In an embodiment, pressure losses are separately calculated and then added for the total pressure loss. These change as the velocity or the flowrate increases.

In block 712, the method then displays this information on a suitable computer screen to the UBD drilling engineer.

Figure 8:
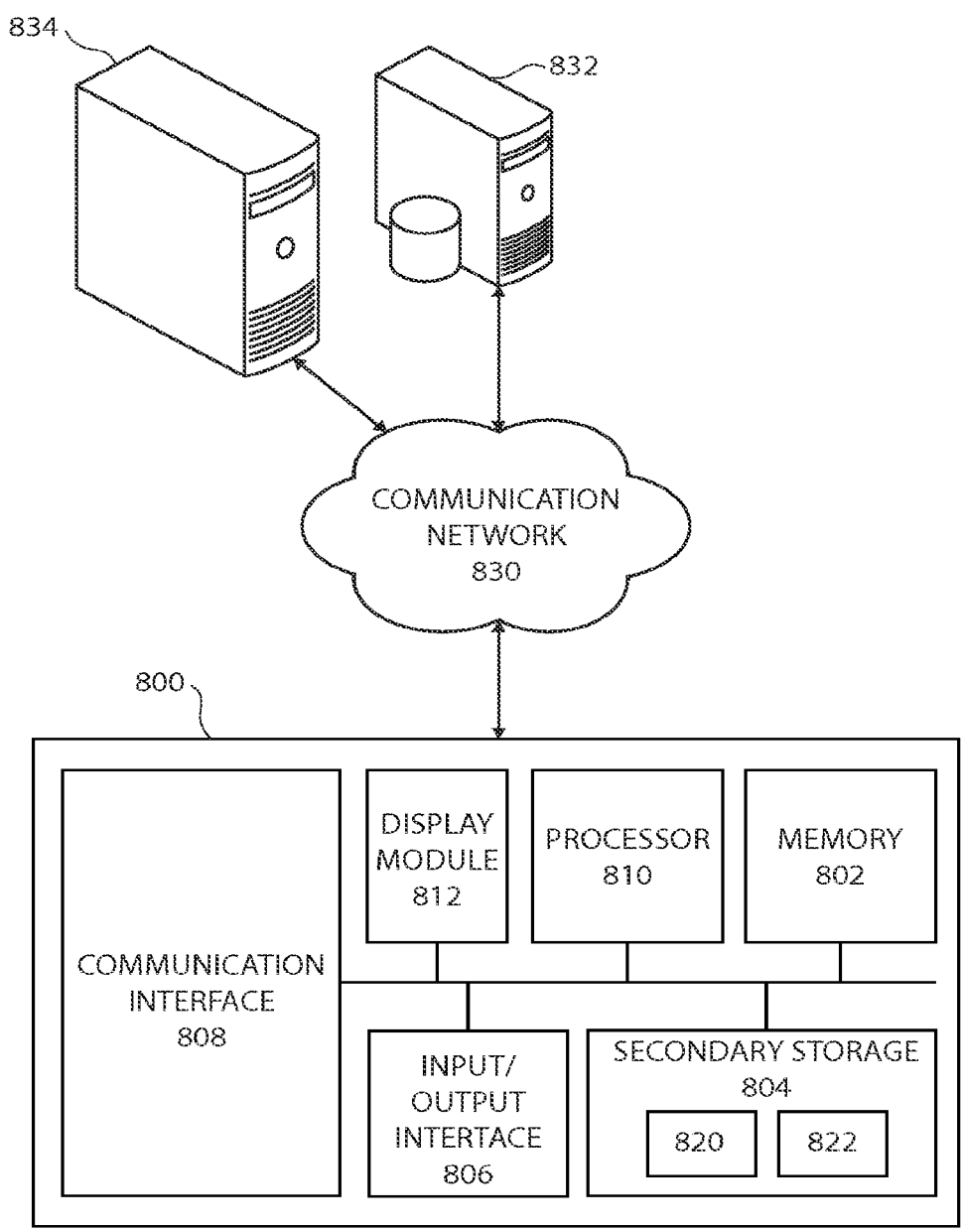
FIG. 8 illustrates a computer system useful in implementations of the invention.

FIG. 8 is a block diagram illustrating one embodiment of a system 800 for implementing the features and functions of the disclosed embodiments. The system 800 may be any type of computing device such as, but not limited to, a personal computer, a server system, a client system, a laptop, a tablet, and a smartphone. The system 800 includes, among other components, a processor 810, main memory 802, secondary storage unit 804, an input/output interface module 806, and a communication interface module 808. The processor 810 may be any type or any number of single core or multi-core processors capable of executing instructions for performing the features and functions of the disclosed embodiments.

The input/output interface module 806 enables the system 800 to receive user input (e.g., from a keyboard and mouse) and output information to one or more devices such as, but not limited to, printers, external data storage devices, and audio speakers. The system 800 may optionally include a separate display module 812 to enable information to be displayed on an integrated or external display device. For instance, the display module 812 may include instructions or hardware (e.g., a graphics card or chip) for providing enhanced graphics, touchscreen, and/or multi-touch functionalities associated with one or more display devices.

Main memory 802 is volatile memory that stores currently executing instructions/data or instructions/data that are prefetched for execution. The secondary storage unit 804 is non-volatile memory for storing persistent data. The secondary storage unit 804 may be or include any type of data storage component such as a hard drive, a flash drive, or a memory card. In one embodiment, the secondary storage unit 804 stores the computer executable code/instructions and other relevant data for enabling a user to perform the features and functions of the disclosed embodiments.

For example, in accordance with the disclosed embodiments, the secondary storage unit 804 may permanently store the executable code/instructions associated with a casing design application 820 for performing the above-described methods. The instructions associated with the casing design algorithm 820 are loaded from the secondary storage unit 804 to main memory 802 during execution by the processor 810 for performing the disclosed embodiments.

The communication interface module 808 enables the system 800 to communicate with the communications network 830. For example, the network interface module 808 may include a network interface card and/or a wireless transceiver for enabling the system 800 to send and receive data through the communications network 830 and/or directly with other devices.

The communications network 830 may be any type of network including a combination of one or more of the following networks: a wide area network, a local area network, one or more private networks, the Internet, a telephone network such as the public switched telephone network (PSTN), one or more cellular networks, and wireless data networks. The communications network 630 may include a plurality of network nodes (not depicted) such as routers, network access points/gateways, switches, DNS servers, proxy servers, and other network nodes for assisting in routing of data/communications between devices.

For example, in one embodiment, the system 800 may interact with one or more servers 834 or databases 832 for performing the features of the present invention. For instance, the system 800 may query the database 832 to obtain well data for updating the three dimensional tunnel view of the operating envelope in real-time in accordance with the disclosed embodiments. Further, in certain embodiments, the system 800 may act as a server system for one or more client devices or a peer system for peer to peer communications or parallel processing with one or more devices/computing systems (e.g., clusters, grids).

While specific details about the above embodiments have been described, the above hardware and software descriptions are intended merely as example embodiments and are not intended to limit the structure or implementation of the disclosed embodiments. For instance, although many other internal components of the system 800 are not shown, those of ordinary skill in the art will appreciate that such components and their interconnection are well known.

In addition, certain aspects of the disclosed embodiments, as outlined above, may be thought of as "products" or "articles of manufacture" typically in the form of executable code and/or associated data that is carried on or embodied in a type of tangible non-transitory machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the executable code.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As set forth above, the embodiments disclosed herein may be implemented in a number of ways. In general, in one aspect, the disclosed embodiments are directed to a computer implemented method for underbalanced drilling. The method comprises, among other things, determining a plurality of gas injection rate versus bottom hole pressure curves for a plurality of liquid injection rates for a specified minimum and maximum gas injection rate and a minimum and maximum liquid injection rate. The method also comprises determining a set of four interception curves including a minimum motor equivalent liquid rate interception curve, a minimum vertical liquid velocity intercept curve, a minimum horizontal liquid velocity intercept curve, and a maximum motor equivalent liquid rate intercept curve for a specified minimum and maximum mud motor rate range and a minimum horizontal and vertical annulus velocity. The method further comprises identifying an operation envelope based on the interception curves, determining the intersection points between the operation envelope and a target pressure curve to define a UBD operation zone, determining the minimum bottom hole pressure point for each gas injection rate versus bottom hole pressure curve, determining the average point of all minimum bottom hole pressure points, and determining a plurality of hydraulic zones based on the average of all minimum bottom hole pressure points. An optimized UBD operation envelope is then displayed simultaneously depicting and identifying the UBD operation zone and the plurality of hydraulic zones.

In general, in another aspect, the disclosed embodiments are directed to a computer readable medium comprising computer executable instructions for optimizing underbalanced drilling operations. The computer executable instructions when executed cause one or more machines to, among other things, determine a plurality of gas injection rate versus bottom hole pressure curves for a plurality of liquid injection rates for a specified minimum and maximum gas injection rate and a minimum and maximum liquid injection rate. The computer executable instructions also cause one or more machines to determine a set of four interception curves including a minimum motor equivalent liquid rate interception curve, a minimum vertical liquid velocity intercept curve, a minimum horizontal liquid velocity intercept curve, and a maximum motor equivalent liquid rate intercept curve for a specified minimum and maximum mud motor rate range and a minimum horizontal and vertical annulus velocity. The computer executable instructions further cause one or more machines to identify an operation envelope based on the interception curves, determine the intersection points between the operation envelope and a target pressure curve to define a UBD operation zone, determine the minimum bottom hole pressure point for each gas injection rate versus bottom hole pressure curve, determine the average point of all minimum bottom hole pressure points, and determine a plurality of hydraulic zones based on the average of all minimum bottom hole pressure points. An optimized UBD operation envelope is then displayed simultaneously depicting and identifying the UBD operation zone and the plurality of hydraulic zones.

In general, in yet another aspect, the disclosed embodiments are directed to a system for performing underbalanced drilling operations. The system comprises at least one processor having a computer memory including stored instructions that when executed cause the at least one processor to, among other things, determine a plurality of gas injection rate versus bottom hole pressure curves for a plurality of liquid injection rates for a specified minimum and maximum gas injection rate and a minimum and maximum liquid injection rate. The at least one processor also determines a set of four interception curves including a minimum motor equivalent liquid rate interception curve, a minimum vertical liquid velocity intercept curve, a minimum horizontal liquid velocity intercept curve, and a maximum motor equivalent liquid rate intercept curve for a specified minimum and maximum mud motor rate range and a minimum horizontal and vertical annulus velocity. The at least one processor also identifies an operation envelope based on the interception curves, determines the intersection points between the operation envelope and a target pressure curve to define a UBD operation zone, determines the minimum bottom hole pressure point for each gas injection rate versus bottom hole pressure curve, determines the average point of all minimum bottom hole pressure points; and determines a plurality of hydraulic zones based on the average of all minimum bottom hole pressure points. An optimized UBD operation envelope is then displayed simultaneously depicting and identifying the UBD operation zone and the plurality of hydraulic zones.

While the disclosed embodiments have been described with reference to one or more particular implementations, those skilled in the art will recognize that many changes may be made thereto without departing from the spirit and scope of the description. Accordingly, each of these embodiments and obvious variations thereof is contemplated as falling within the spirit and scope of the claimed invention, which is set forth in the following claims.

What is claimed is:

1. A computer-implemented method for optimized underbalanced drilling, comprising:
   determining a plurality of gas injection rate versus bottom hole pressure curves for a plurality of liquid injection rates for specified minimum and maximum gas injection rates and minimum and maximum liquid injection rates;
   determining a set of interception curves for a specified minimum and maximum mud motor rate range and a minimum horizontal and vertical annulus velocity, wherein the set of interception curves comprises a minimum mud motor equivalent liquid rate interception curve, a minimum vertical liquid velocity intercept curve, a minimum horizontal liquid velocity intercept curve, and a maximum motor equivalent liquid rate intercept curve;
   identifying an operation envelope based on the set of interception curves;
   determining intersection points between the operation envelope and a target pressure curve to define an underbalanced drilling (UBD) operation zone;
   determining a minimum bottom hole pressure point for each gas injection rate versus bottom hole pressure curve of the plurality of gas injection rate versus bottom hole pressure curves; determining an average point of all minimum bottom hole pressure points;
   determining a plurality of hydraulic zones based on the average point of all minimum bottom hole pressure points; identifying an optimized UBD operation envelope; and
   operating a mud motor by using a drilling fluid having at least two phases to rotate a drill bit while maintaining well conditions within boundaries of the optimized UBD operation envelope.

2. The computer-implemented method of claim 1, wherein the plurality of hydraulic zones comprise a hydrostatic dominated zone, a friction dominated zone, a transition zone, or a combination thereof.

3. The computer-implemented method of claim 2, further comprising:
   displaying the optimized UBD operation envelope simultaneously depicting and identifying the UBD operation zone and the hydrostatic dominated zone, the friction dominated zone, and the transition zone during UBD operations.

4. The computer-implemented method of claim 1, further comprising:
   selecting the mud motor based on the optimized UBD operation envelope.

5. The computer-implemented method of claim 1, wherein the specified minimum and maximum gas injection rates are determined using hole cleaning parameters, combustion level, hole erosion specifications, or a combination thereof.

6. The computer-implemented method of claim 1, wherein the optimized UBD operation envelope is determined using mud motor parameters and minimum horizontal and vertical hole cleaning parameters.

7. A non-transitory computer-readable medium comprising computer executable instructions for optimizing underbalanced drilling operations, the computer executable instructions when executed cause one or more machines to perform operations comprising:
   determining a plurality of gas injection rate versus bottom hole pressure curves for a plurality of liquid injection rates for specified minimum and maximum gas injection rates and minimum and maximum liquid injection rates;
   determining a set of interception curves for a specified minimum and maximum mud motor rate range and a minimum horizontal and vertical annulus velocity, wherein the set of interception curves comprises a minimum mud motor equivalent liquid rate interception curve, a minimum vertical liquid velocity intercept curve, a minimum horizontal liquid velocity intercept curve, and a maximum motor equivalent liquid rate intercept curve;
   identifying an operation envelope based on the set of interception curves;
   determining intersection points between the operation envelope and a target pressure curve to define an underbalanced drilling (UBD) operation zone;
   determining a minimum bottom hole pressure point for each gas injection rate versus bottom hole pressure curve of the plurality of gas injection rate versus bottom hole pressure curves; determining an average point of all minimum bottom hole pressure points;
   determining a plurality of hydraulic zones based on the average point of all minimum bottom hole pressure points; identifying an optimized UBD operation envelope; and
   operating a mud motor by using a drilling fluid having at least two phases to rotate a drill bit while maintaining well conditions within boundaries of the optimized UBD operation envelope.

8. The non-transitory computer-readable medium of claim 7, wherein the plurality of hydraulic zones comprise a hydrostatic dominated zone, a friction dominated zone, a transition zone, or a combination thereof.

9. The non-transitory computer-readable medium of claim 8, wherein the operations further comprise:
displaying the optimized UBD operation envelope simultaneously depicting and identifying the UBD operation zone and the hydrostatic dominated zone, the friction dominated zone, and the transition zone during UBD operations.

10. The non-transitory computer-readable medium of claim 7, wherein the operations further comprise:
selecting the mud motor based on the optimized UBD operation envelope.

11. The non-transitory computer-readable medium of claim 7, wherein the specified minimum and maximum gas injection rates are determined using hole cleaning parameters, combustion level, hole erosion specifications, or a combination thereof.

12. The non-transitory computer-readable medium of claim 7, wherein the optimized UBD operation envelope is determined using mud motor parameters and minimum horizontal and vertical hole cleaning parameters.

13. A system for performing optimized underbalanced drilling operations, comprising:
at least one processor; and
a non-transitory computer-readable medium including stored instructions that when executed by the at least one processor cause the at least one processor to perform operations comprising:
determining a plurality of gas injection rate versus bottom hole pressure curves for a plurality of liquid injection rates for specified minimum and maximum gas injection rates and minimum and maximum liquid injection rates;
determining a set of interception curves for a specified minimum and maximum mud motor rate range and a minimum horizontal and vertical annulus velocity, wherein the set of interception curves comprises a minimum mud motor equivalent liquid rate interception curve, a minimum vertical liquid velocity intercept curve, a minimum horizontal liquid velocity intercept curve, and a maximum motor equivalent liquid rate intercept curve;
identifying an operation envelope based on the set of interception curves; determining intersection points between the operation envelope and a target pressure curve to define an underbalanced drilling (UBD) operation zone;
determining a minimum bottom hole pressure point for each gas injection rate versus bottom hole pressure curve of the plurality of gas injection rate versus bottom hole pressure curves;
determining an average point of all minimum bottom hole pressure points;
determining a plurality of hydraulic zones based on the average point of all minimum bottom hole pressure points; identifying an optimized UBD operation envelope; and
operating a mud motor by using a drilling fluid having at least two phases to rotate a drill bit while maintaining well conditions within boundaries of the optimized UBD operation envelope.

14. The system of claim 13, wherein the plurality of hydraulic zones comprise a hydrostatic dominated zone, a friction dominated zone, a transition zone, or a combination thereof.

15. The system of claim 14, wherein the operations further comprise:
displaying the optimized UBD operation envelope simultaneously depicting and identifying the UBD operation zone and the hydrostatic dominated zone, the friction dominated zone, and the transition zone during UBD operations.

16. The system of claim 13, wherein the operations further comprise:
selecting the mud motor based on the optimized UBD operation envelope.

17. The system of claim 13, wherein the specified minimum and maximum gas injection rates are determined using hole cleaning parameters, combustion level, hole erosion specifications, or a combination thereof.

* * * * *